May 3, 1966 H. J. NAAKE 3,249,470
METHOD OF JOINING THERMOELECTRIC ELEMENTS AND THERMOCOUPLE
Filed Feb. 26, 1962
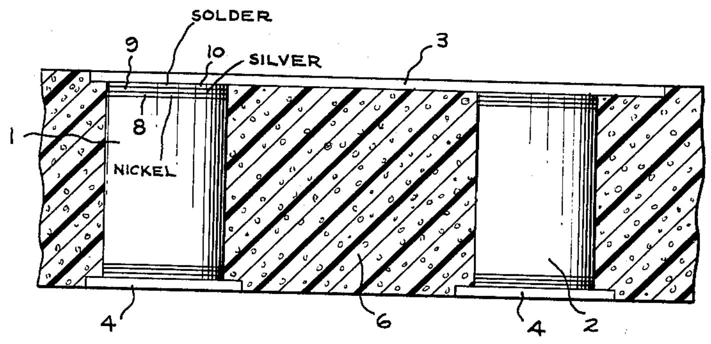
INVENTOR.
HANS J. NAAKE
BY Walter E. Kule
HIS ATTORNEY 3,249,470
Patented May 3, 1966

3,249,470

METHOD OF JOINING THERMOELECTRIC ELEMENTS AND THERMOCOUPLE

Hans J. Naake, Louisville, Ky., assignor to General Electric Company, a corporation of New York Filed Feb. 26, 1962, Ser. No. 175,526
4 Claims. (Cl. 136—4)

The present invention relates to thermocouples comprising series connected thermoelectric elements and is more particularly concerned with an improved method of joining such elements.

Thermoelectric cooling units comprise pairs of dissimilar thermoelectric elements, that is P-type and N-type elements, alternately and series connected so that when a direct current is passed through the series connected elements, there is produced a set of cold junctions and a set of hot junctions. In accordance with the usual practice, junction members, in the form of sheets or strips of copper, aluminum or other good electrically and heat conducting material soldered to the spaced elements, have been employed to connect the dissimilar elements. It is well known that the electrical and mechanical properties of the soldered joints have a substantial affect on the life and performance of the units. The electrical resistance of the cold junction reduces the figure of merit of the individual couples while the junction resistance at the hot end increases the power which has to be dissipated by the hot junction. This power increase in turn increases the hot junction temperature and by conduction of heat through the individual elements indirectly increases the cold junction temperature. Thus it is highly desirable from a performance standpoint that the electrical resistance of the soldered joints between the elements and the junction members be held to a minimum. In addition it is necessary that the soldered joints be mechanically strong in order to avoid failure of the thermoelectric units due to fracture of the soldered joints as a result of thermal or other forces transmitted to the joints during use and operation of the unit.

In the mass production of thermoelectric units, difficulties have been encountered in the production of the junctions between the elements and junction members. Direct soldering methods by which the junction members are soldered directly to the element surfaces have been found to produce joints of varying strengths and resistances. Also to obtain proper wetting of the bismuth telluride surfaces, relatively high melting point bismuth or bismuth-tin alloys are required. Frequently, the direct soldering processes have been found to degrade the thermoelectric properties of the elements either immediately or after a period of aging or use.

It is an object of the present invention to provide an improved method for joining thermoelectric elements whereby there may be obtained uniformly strong soldered joints having uniformly acceptable joint resistances.

Another important object of the invention is to provide an improved thermocouple joint exhibiting a minimum tendency for deterioration of the thermoelectric properties of the thermocouples during manufacture and use.

Further objects and advantages of the invention will become apparent from the following description of the invention and the features of novelty which characterize the invention will be pointed out with particularity in the claims annexed to and forming part of this specification.

In carrying out the objects of the present invention, thermoelectric elements having dissimilar thermoelectric properties as for example P-type and N-type bismuth telluride elements are suitably cleaned as for example by treatment with a nitric-hydrochloric acid solution for removing any surface contamination resulting from the manufacture of the elements. The surfaces of the elements which are to be joined are then provided with a first or base layer of electrodeposited nickel and a second layer or coating of electrodeposited silver applied directly to the nickel layer. The joints between the coated elements and the junction members of copper or the like are then formed by soldering the junction members directly to the silver coatings or layers employing any of the usual soldering materials generally used for such purposes as for example, tin or tin-lead base alloys.

For a better understanding of the invention, reference may be had to the accompanying drawing in which the single figure is a sectional view of a portion of a thermoelectric unit.

With reference to the accompanying drawing, there is illustrated a thermocouple forming part of a larger thermoelectric unit for cooling purposes. Such a unit includes a plurality of dissimilar thermoelectric elements 1 and 2 arranged in pairs and having their one ends connected by means of junction members 3 and the other ends of the elements 1 and 2 are connected by junction members 4 to form a plurality of thermocouples in which the junction members 3 form either a hot or cold junction and the members 4 form the opposite junction. A layer of heat and electrically insulating material 6, such as a foamed resinous material, is provided to fill the space between the junction members 3 and 4 and this insulating material preferably completely embeds the thermoelectric elements 1 and 2 and their connecting means 3 and 4.

The thermoelectric properties of the resultant thermocouples are dependent primarily upon the thermoelectric properties of the respective elements 1 and 2 forming the individual couples. When a direct current is passed through the unit so that for example the junction members form hot or heat dissipating junctions and the junction members 3 form the cold or cooling junctions heat will be absorbed by the junctions 3 and dissipated at the junctions 4. However any resistance heat generated within the thermocouple during passage of the current plays an important role in the overall performance of the thermocouple and measurably detracts from its figure of merit. Any junction resistance between the dissimilar elements 1 and 2 and the junction members 3 results in additional heat which must be dissipated at the heat dissipating junctions 4 and in effect decreases the cooling effect of the cold junctions 3. Any junction resistance at the hot junctions increases the power which has to be dissipated by these junctions and by increasing the temperature differential between the hot and cold junctions tends to produce a greater heat flow from the hot to the cold junctions through the thermoelectric elements so that it also indirectly increases the cold junction temperatures. Thus the nature and quality of the soldered joints between the elements and the junction members has a marked effect on the overall performance of each thermocouple as a cooling element.

In accordance with the present invention, strong, low resistance junctions are uniformly obtained by a method which comprises precoating the ends of the elements 1 and 2 which are to be soldered to the junction members 3 and 4. Specifically. the ends of the elements 1 and 2, respectively comprising P and N type bismuth telluride materials, which are to be joined to the junction members 3 and 4 are first cleaned and etched by treatment with an etchant consisting of a mixture of one part hydrochloric acid, one part nitric acid and about 2 parts water at a temperature of approximately 50° C. This treatment has been found effective to remove the disturbed surface layers from the ends of the elements produced by the cutting or grinding operations employed in the manufacture of the elements. The treated surfaces are then rinsed with water preferably without being dried or allowed to come into contact with the air between the etching and rinsing operations.

The clean surfaces are then coated with an electrodeposited layer 8 of nickel using for example a well known Watts bath for the nickel plating. One bath successfully employed for this purpose comprises a solution of 300 parts, by weight, nickel sulphate, 60 parts nickel chloride and 38 parts boric acid per 1000 parts of solution. Plating is continued at current densities of, for example, 25 to 50 amp./sq. ft. until a continuous layer of nickel is formed.

In addition to providing an adherent coating on the bismuth telluride elements, the nickel layer also serves to prevent metals present in the solder or migrating into the solder from the junction members 3 and 4 from diffusing into the bismuth telluride elements. Some metals like copper are able to diffuse into the bismuth telluride even at room temperature and it is believed that the migration or diffusion of copper into bismuth telluride elements is responsible for deterioration of the thermoelectric properties of such elements during use. Since copper may also be present in commercial grade solder materials or may dissolve into the solder layer when copper or copper-containing junction members are employed for making the current connections between the dissimilar elements, the nickel layer forms an effective barrier to prevent such diffusion and thereby provides a thermocouple having a decreased tendency for deterioration of its thermoelectric properties during use.

To provide a wettable surface for subsequent soldering, the nickel layer 8 is thereafter coated with an electrodeposited layer 9 of silver which provides a surface that can be soft soldered easily and without the use of acid fluxes or the like which might cause corrosion of the soldered elements near the joints. Silver also resists oxidation which is important if the coated elements are to be stored for any length of time before they are joined to the junction members 3 and 4.

For the purpose of applying the silver layer, any conventional silver plating bath can be employed. One such bath comprises, by weight, from 25 to 33 parts by weight of silver, 30 to 45 parts potassium cyanide, 30 to 90 parts potassium carbonate and a fraction of a part of carbon disulfide brightener per 1000 parts of solution. Current densities of from 5 to 15 amps./sq. ft. have been successfully employed.

For the final soldering operation, a layer 10 of any suitable soft solder may be used and conventional soft soldering techniques are employed. Good results have been obtained employing a 60% tin–40% lead solder and a rosin flux and by heating the tinned or untinned junction members, preferably composed of copper or solderable copper alloys, to a temperature sufficient to effect the soldering operation.

The resultant thermocouples, in addition to having low joint resistances are also of sufficient strength to withstand the forces resulting from the normal thermal expansion or mechanical stresses to which the thermocouple may be subjected during manufacture, use and operation.

Low cost, low melting point solders can be employed with rosin rather than strong acid fluxes. As the nickel layer effectively prevents migration of undesirable impurities from the solder or junction members into the elements, the thermoelectric properties of the elements are not significantly altered by the joining operation. Further, the properties of the resultant units remain stable during use.

While the invention has been described with reference to a particular embodiment thereof, it will be understood that it is not limited thereto and it is intended by the appended claims to cover all such modifications as fall within the true spirit and scope of the invention.

What I claim as new and desire to secure by Letters Patent of the United States is:

1. The method of joining a bismuth telluride element to a solderable metal member which consists of the steps of:

(a) electroplating a layer of nickel onto a surface of said element,
(b) electroplating a layer of silver onto the nickel plated surface; and
(c) soldering the silver plated surface to said solderable metal member using a soft tin-lead solder and a rosin flux.

2. The method of joining a bismuth telluride element to a solderable metal member which consists of the steps of:

(a) etching a surface of said element with an aqueous solution of nitric and hydrochloric acids,
(b) electroplating a layer of nickel onto said surface,
(c) electroplating a layer of silver onto the nickel plated surface, and
(d) soldering the silver plated surface to said solderable metal member by means of a soft tin-lead solder and a rosin flux.

3. A thermoelectric unit comprising a pair of dissimilar thermoelectric elements, a layer of electroplated nickel on a surface of each of said elements, a layer of electroplated silver on said nickel layers and a solderable conductor soldered to said silver layers by a layer of soft tin-lead solder.

4. A thermoelectric unit comprising a bismuth telluride element, a layer of electroplated nickel on a surface of said element, a layer of electroplated silver on said nickel layer and a solderable metal conductor soldered to said silver layer by a layer of soft tin-lead solder.

References Cited by the Examiner

UNITED STATES PATENTS

| | | | |
|---|---|---|---|
| 2,990,439 | 6/1961 | Goldsmid et al. | 136—5 |
| 2,977,400 | 3/1961 | Cornish | 136—5 |
| 3,031,516 | 4/1962 | Pessel | 136—5 |
| 3,060,253 | 10/1962 | Wildi et al. | 136—5 |
| 3,079,455 | 2/1963 | Haba | 136—5 |

FOREIGN PATENTS

| | | |
|---|---|---|
| 746,963 | 3/1956 | Great Britain. |

WINSTON A. DOUGLAS, *Primary Examiner.*

JOHN R. SPECK, *Examiner.*

D. L. WALTON, A. B. CURTIS, *Assistant Examiners.*